(12) United States Patent
Liu et al.

(10) Patent No.: US 7,723,181 B2
(45) Date of Patent: *May 25, 2010

(54) OVERLAY ALIGNMENT MARK AND ALIGNMENT METHOD FOR THE FABRICATION OF TRENCH-CAPACITOR DRAM DEVICES

(75) Inventors: An-Hsiung Liu, Tao-Yuan Hsien (TW); Chiang-Lin Shih, Taipei Hsien (TW); Wen-Bin Wu, Tao-Yuan Hsien (TW); Hui-Min Mao, Taipei (TW); Lin-Chin Su, Taipei Hsien (TW); Pei-Ing Lee, Chang-Hua Hsien (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 390 days.

This patent is subject to a terminal disclaimer.

(21) Appl. No.: 11/616,849

(22) Filed: Dec. 27, 2006

(65) Prior Publication Data
US 2007/0190736 A1    Aug. 16, 2007

(30) Foreign Application Priority Data
Feb. 16, 2006 (TW) .............................. 95105278 A

(51) Int. Cl.
*H01L 21/8242* (2006.01)

(52) U.S. Cl. .................. 438/243; 438/386; 438/401; 257/E27.092; 257/E29.346; 257/E21.396
(58) Field of Classification Search ................ 438/238, 438/239, 243, 381, 386, 387, 401; 257/301, 257/E27.092, E29.346, E21.396
See application file for complete search history.

(56) References Cited

U.S. PATENT DOCUMENTS

| | | | |
|---|---|---|---|
| 5,411,913 A * | 5/1995 | Bashir et al. ................. | 438/427 |
| 6,447,634 B1 | 9/2002 | Zahorik | |
| 6,624,039 B1 * | 9/2003 | Abdelgadir et al. ......... | 438/401 |
| 6,841,307 B2 | 1/2005 | Tani | |
| 6,841,402 B1 | 1/2005 | Hirayanagi | |
| 6,908,514 B2 | 6/2005 | Chang | |
| 6,937,334 B2 | 8/2005 | Monshouwer | |
| 7,419,882 B2 * | 9/2008 | Wu et al. ..................... | 438/386 |
| 2006/0234440 A1 * | 10/2006 | Wu et al. ..................... | 438/243 |

* cited by examiner

*Primary Examiner*—Brook Kebede
(74) *Attorney, Agent, or Firm*—Winston Hsu

(57) ABSTRACT

A small-size (w<0.5 micrometers) alignment mark in combination with a "k1 process" is proposed, which is particularly suited for the fabrication of trench-capacitor DRAM devices which requires highly accurate AA-DT and GC-DT overlay alignment. The "k1 process" is utilized to etch away polysilicon studded in the alignment mark trenches and to refresh the trench profile, thereby improving overlay alignment accuracy and precision.

12 Claims, 10 Drawing Sheets

OVERLAY ALIGNMENT MARK AND ALIGNMENT METHOD FOR THE FABRICATION OF TRENCH-CAPACITOR DRAM DEVICES

BACKGROUND OF THE INVENTION

1. Field of the Invention

The present invention relates generally to the manufacture of microelectronic devices involving the use of optical lithographic processes, and more particularly, to a method for improving AA-DT (active area-deep trench) and GC-DT (gate conductor-deep trench) overlay or alignment accuracy during the fabrication of a deep-trench capacitor dynamic random access memory (DRAM) device and alignment method thereof.

2. Description of the Prior Art

Semiconductor integrated circuits undergo a variety of processing steps during manufacture, such as masking, resist coating, etching, and deposition. In many of these steps, material is overlaid or removed from the existing layer at specific locations in order to form the desired elements of the integrated circuit. Proper alignment of the various process layers is therefore critical. The shrinking dimensions of modern integrated circuits require increasingly stringent overlay alignment accuracy during pattern transfer. If the proper alignment tolerance is not achieved, the result is a device that is defective or has reliability problems.

Reduction type projection printing has been known as an apparatus of projection exposure for transferring a pattern drawn on a reticle to a resist. In reduction type projection printing process, a step and repeat method is used. The step and repeat method refers to a method of transferring a reticle pattern to a resist in which exposure is performed every time a wafer on a two-dimensionally movable x-y stage is moved in any given direction. A beam such as i-line or laser is directed from a light source through a condenser lens to a reticle. The beam which passes through the reticle is projected on a photoresist on a wafer fixed on a wafer x-y stage through a reduction projection lens. Position of the wafer is automatically moved successively in x, y directions by the wafer x-y stage and the wafer is exposed shot-by-shot.

Registration is typically used to measure the accuracy of a process layer alignment performed using an alignment mark. Registration involves comparing the position of a subsequent layer to that of an existing layer by overlaying a distinct pattern on a matching pattern previously formed on the existing layer. The deviation in position of the overlay from the original provides a measure of accuracy of the alignment. Currently available registration structures include box-in-box visual verniers to determine the extent of registration, i.e., the amount of alignment offset.

However, to the complex process for fabricating the trench-capacitor DRAM devices, the AA-DT (active area-deep trench) and GC-DT (gate conductor-deep trench) overlay accuracy are still not satisfactory.

SUMMARY OF THE INVENTION

It is one object of the present invention to provide an improved overlay (alignment) mark and alignment method suited for the fabrication of microelectronic devices such as trench-capacitor DRAM devices which requires highly accurate AA-DT and GC-DT overlay accuracy.

The claimed invention discloses a method for fabricating a microelectronic device. The method includes the following steps:

providing a semiconductor substrate comprising thereon a device region and an alignment-mark forming region;

etching a capacitor trench into the semiconductor substrate within the device region, and simultaneously, etching a previous-layer alignment pattern into the semiconductor substrate within the alignment-mark forming region, wherein the previous-layer alignment pattern comprises a plurality of trench lines each of which has a line width that is less than or equal to 0.5 micrometer;

forming a trench capacitor structure within the capacitor trench comprising at least depositing polysilicon into the capacitor trench, wherein the polysilicon also deposits into the plurality of trench lines;

forming a first photo resist layer on the semiconductor substrate and performing an exposure process to form an opening in the first photo resist layer, wherein the opening only exposes the previous-layer alignment pattern in the alignment-mark forming region;

using the first photo resist layer as an etching hard mask, performing an etching process to etch away the polysilicon inside the trench lines;

stripping the first photo resist layer;

coating a second photo resist layer on the semiconductor substrate;

performing an exposure on the second photo resist layer using a photo mask bearing an active area pattern and transferring the active area pattern to the second photo resist layer, and simultaneously, forming an existing-layer photo resist pattern within the alignment-mark forming region, wherein the existing-layer photo resist pattern and the previous-layer alignment pattern together form an overlay mark; and using the overlay mark to assess AA-DT (active area-deep trench) overlay accuracy.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The invention can be fully understood by reading the following detailed description of the preferred embodiments, with reference made to the accompanying drawings as follows.

DETAILED DESCRIPTION

The present invention pertains to a small-size (w<0.5 micrometers) alignment pattern in combination with a "k1 process" for refreshing the alignment pattern, which is particularly suited for the fabrication of deep trench-capacitor DRAM devices which requires highly accurate AA-DT and GC-DT overlay accuracy. As known in the art, the front-end process for fabricating the deep trench-capacitor DRAM devices comprises deep trench capacitor process, active area definition and shallow trench isolation (STI) process.

In general, the prior art method for fabricating a deep trench capacitor of a DRAM device (front end) can be summarized as follows:

Stage 1: deep trench etching (Photo mask-One).
Stage 2: buried plate and capacitor dielectric formation.
Stage 3: first polysilicon deep trench fill and first recess etching.
Stage 4: collar oxide formation.
Stage 5: second polysilicon deposition and second recess etching.
Stage 6: collar oxide wet etching.
Stage 7: third polysilicon deposition and third recess etching.
Stage 8: STI process and active area (AA) definition (Photo mask-Two; also referred to as "AA photo").

Figure 1:
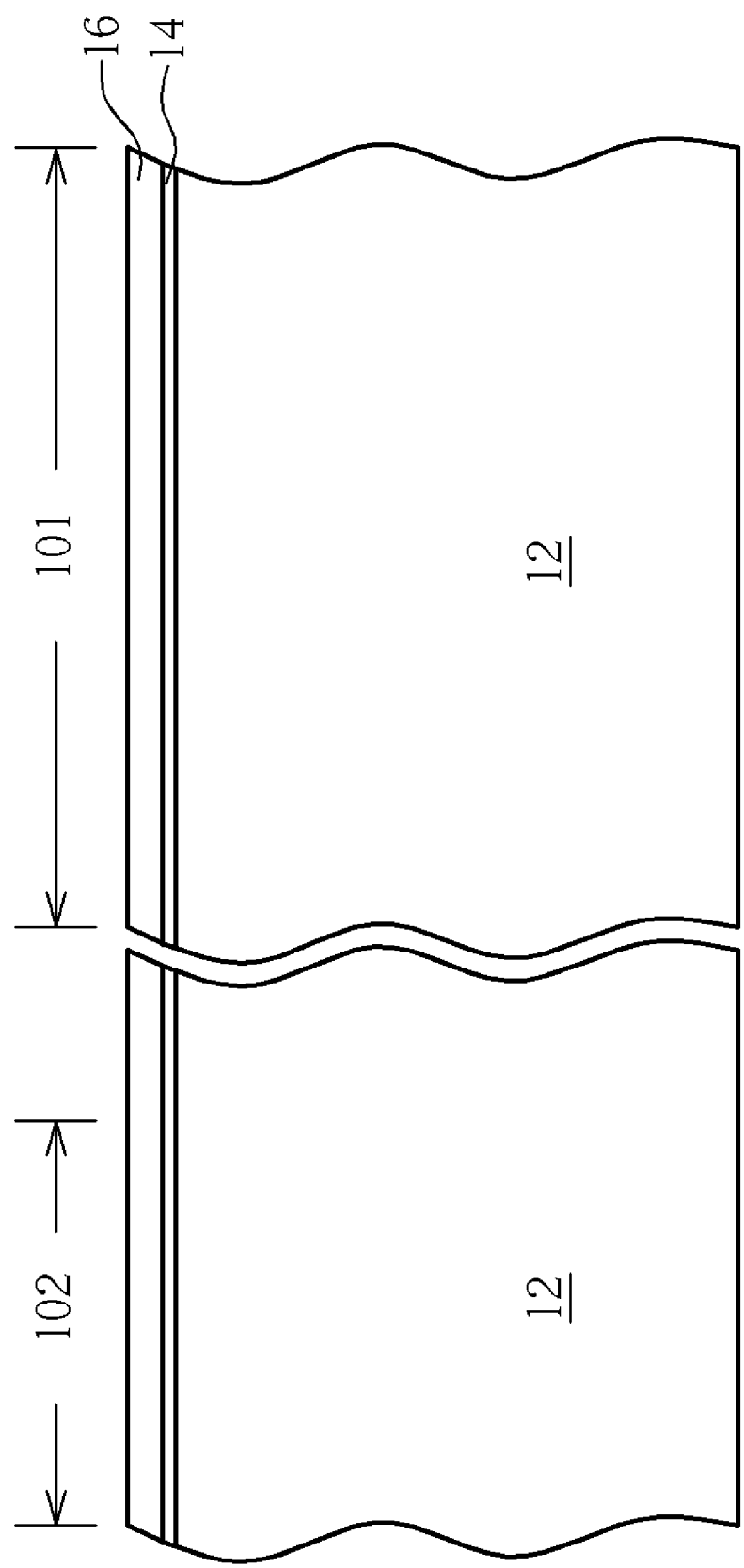
FIGS. 1-7 are schematic, cross-sectional diagrams illustrating the alignment method utilized in the fabrication of a deep-trench capacitor dynamic random access memory (DRAM) device in accordance with one preferred exemplary embodiment of this invention.

Please refer to FIGS. 1-7. FIGS. 1-7 are schematic, cross-sectional diagrams illustrating the alignment method utilized in the fabrication of a deep-trench capacitor dynamic random access memory (DRAM) device in accordance with one preferred exemplary embodiment of this invention. As shown in FIG. 1, a device region 101 and an alignment-mark forming region 102 are defined on the semiconductor substrate 12. A pad oxide layer 14 and a pad nitride layer 16 are formed on the surface of the semiconductor substrate 12.

Figure 2:
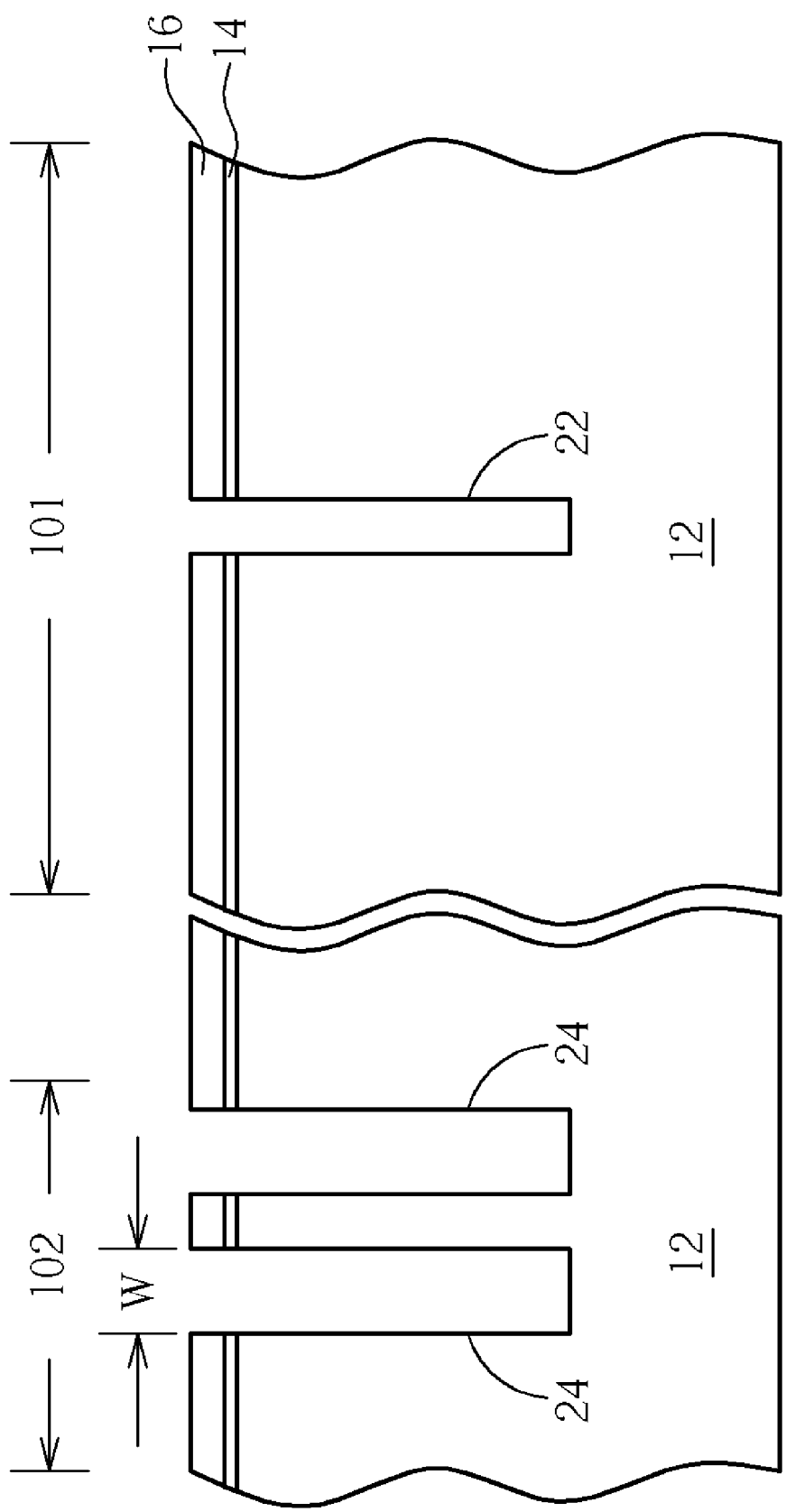
Figure 8:
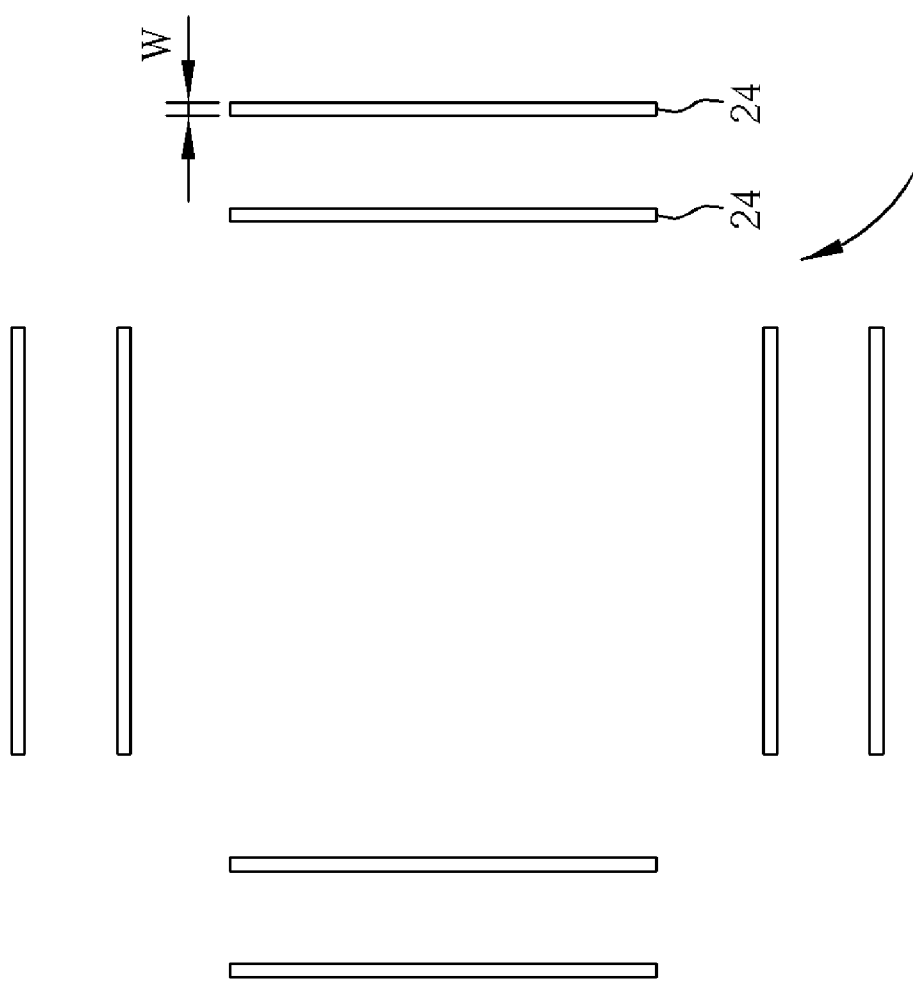
FIG. 8 depicts a schematic top view of the previous-layer alignment pattern in accordance with one preferred exemplary embodiment of this invention.

As shown in FIG. 2, a lithographic process (using the Photo mask-One) and an etching process are carried out to etch a deep trench 22 into the pad nitride layer 16, the pad oxide layer 14 and the semiconductor substrate 12 and etch a previous-layer alignment pattern 20', within the device region 101 and the alignment-mark forming region 102, respectively. Please also refer to FIG. 8. A schematic top view of the previous-layer alignment pattern 20' is depicted in FIG. 8. The previous-layer alignment pattern 20' comprises a plurality of deep trench lines 24. Preferably, the trench width W of each deep trench lines 24 is less than 0.5 micrometer, more preferably 0.2-0.3 micrometer. The trench depth of each deep trench lines 24 of the previous-layer alignment pattern 20' substantially equal to the trench depth of the deep trench 22, both about 8000-angstrom deep, but not limited thereto.

Figure 3:
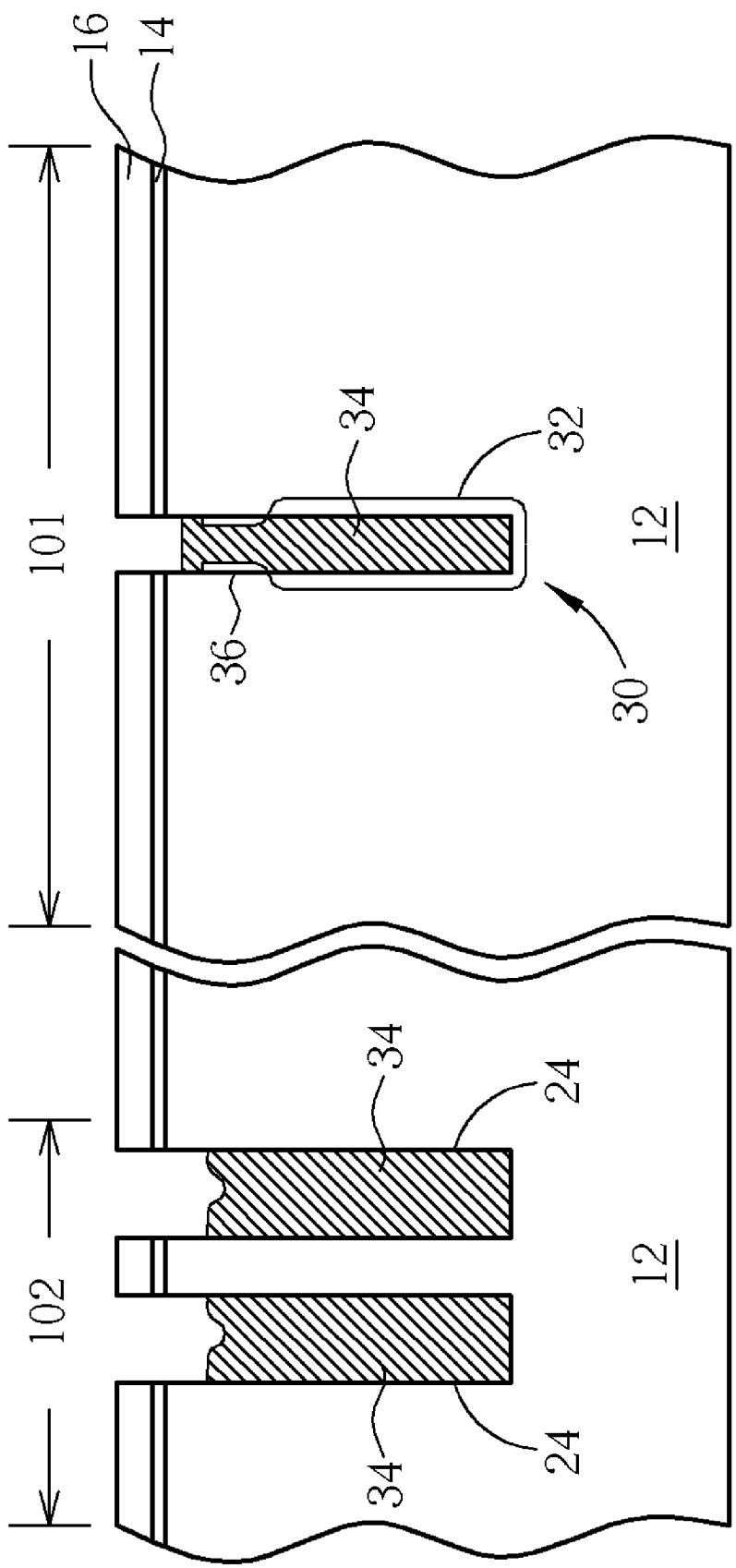

Subsequently, as shown in FIG. 3, a deep trench capacitor structure 30 is formed in the deep trench 22 within the device region 101. The method for forming the deep trench capacitor structure 30 is known in the art, generally including the aforesaid stages 2-7, starting from the formation of buried plate and capacitor dielectric to the third polysilicon deposition and third recess etching. The deep trench capacitor structure 30 generally comprises a buried diffusion plate 32, capacitor dielectric (not explicitly shown), an inner polysilicon layer 34 and a collar oxide 36 disposed on an upper sidewall of the deep trench 22. Meanwhile, within the alignment-mark forming region 102, the polysilicon layer 34 also deposits into the deep trench lines 24.

Figure 4:
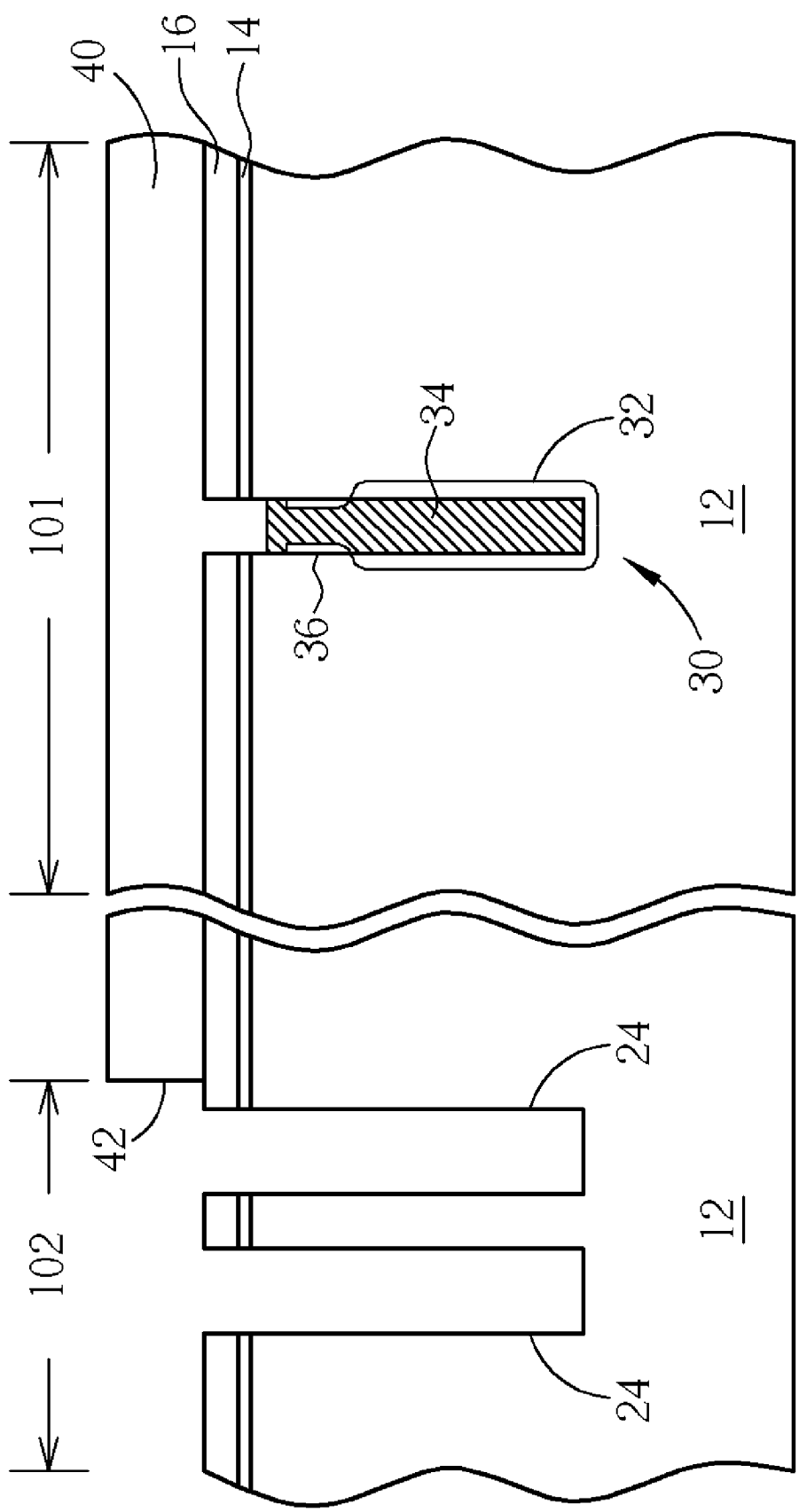

As shown in FIG. 4, a patterned photo resist layer 40 is formed on the semiconductor substrate 12 in order to mask the device region 101. The photo resist layer 40 has an opening 42 that only exposes the alignment-mark forming region 102. It is noted that the photo resist layer 40 is patterned using an additional Photo mask-k1 prior to the STI process and active area (AA) definition (between Photo mask-One and Photo mask-Two).

Thereafter, an etching process is carried out using the photo resist layer 40 and the pad nitride layer as an etching hard mask, the polysilicon layer 34 inside the deep trench lines 24 are etched away through the opening 42 in a self-aligned fashion. According to the preferred embodiments, after the etching process, the depth of the deep trench lines 24 preferably ranges between 3000 angstroms (poly-partially removed) and 8000 angstroms (poly-completely removed). After etching the deep trench lines 24, the photo resist layer 40 is stripped off using methods known in the art.

Hereinafter, the additional lithographic step that involves the use of the aforesaid Photo mask-k1 for patterning the photo resist layer 40 and the succeeding etching process that is used to dig out the trench fill materials inside the deep trench lines 24 of the previous-layer alignment pattern 20' are collectively referred to as "k1 process". It is one salient feature of this invention that the novel "k1 process" is performed after the formation of deep trench capacitor structure in the device region 101 and before the AA definition and STI process (or between conventional Photo masks-One and Two).

The purpose of the "k1 process" is to refresh the previous-layer alignment pattern 20' within the alignment-mark forming region 102. The prior art method does not use such "k1 process". The additional Photo mask-k1 is a trade-off between cost and yield. It is advantageous to use the "k1 process" because the alignment accuracy is significantly improved when the stepper equipments try to focus these alignment marks. The AA-DT alignment accuracy is also significantly improved.

Figure 5:
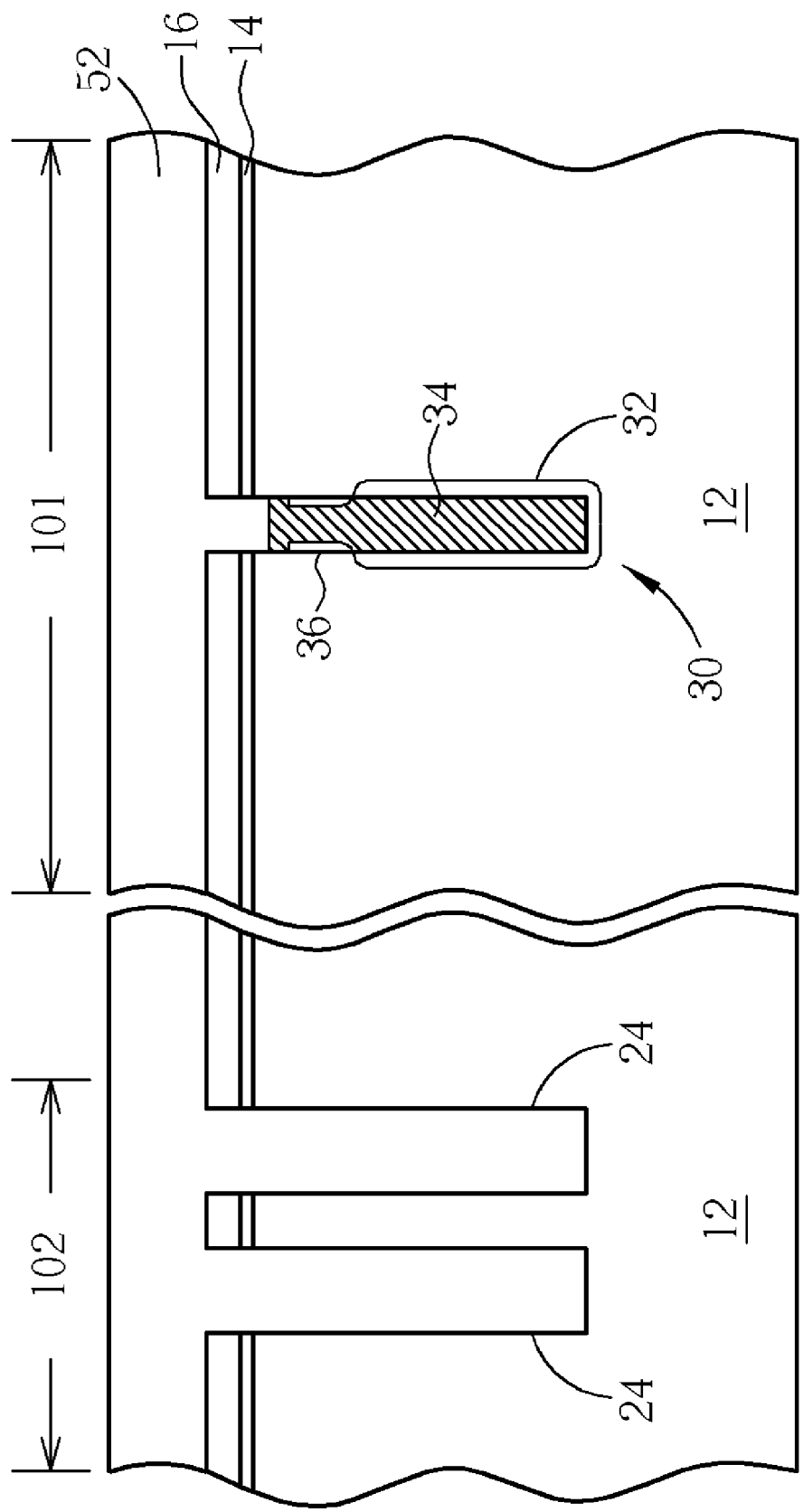

As shown in FIG. 5, after removing the photo resist layer 40, a planarization layer 52 is blanket deposited over the semiconductor substrate 12. According to the preferred embodiments, the planarization layer 52 may be dielectric material such as boron-doped silicate glass (BSG), BPSG, TEOS oxide or combinations thereof. The planarization layer 52 fills the deep trench lines 24 within the alignment-mark forming region 102 and fills the recess on each deep trench capacitor structure 30. The planarization layer 52 presents a substantially planar top surface.

Figure 6:
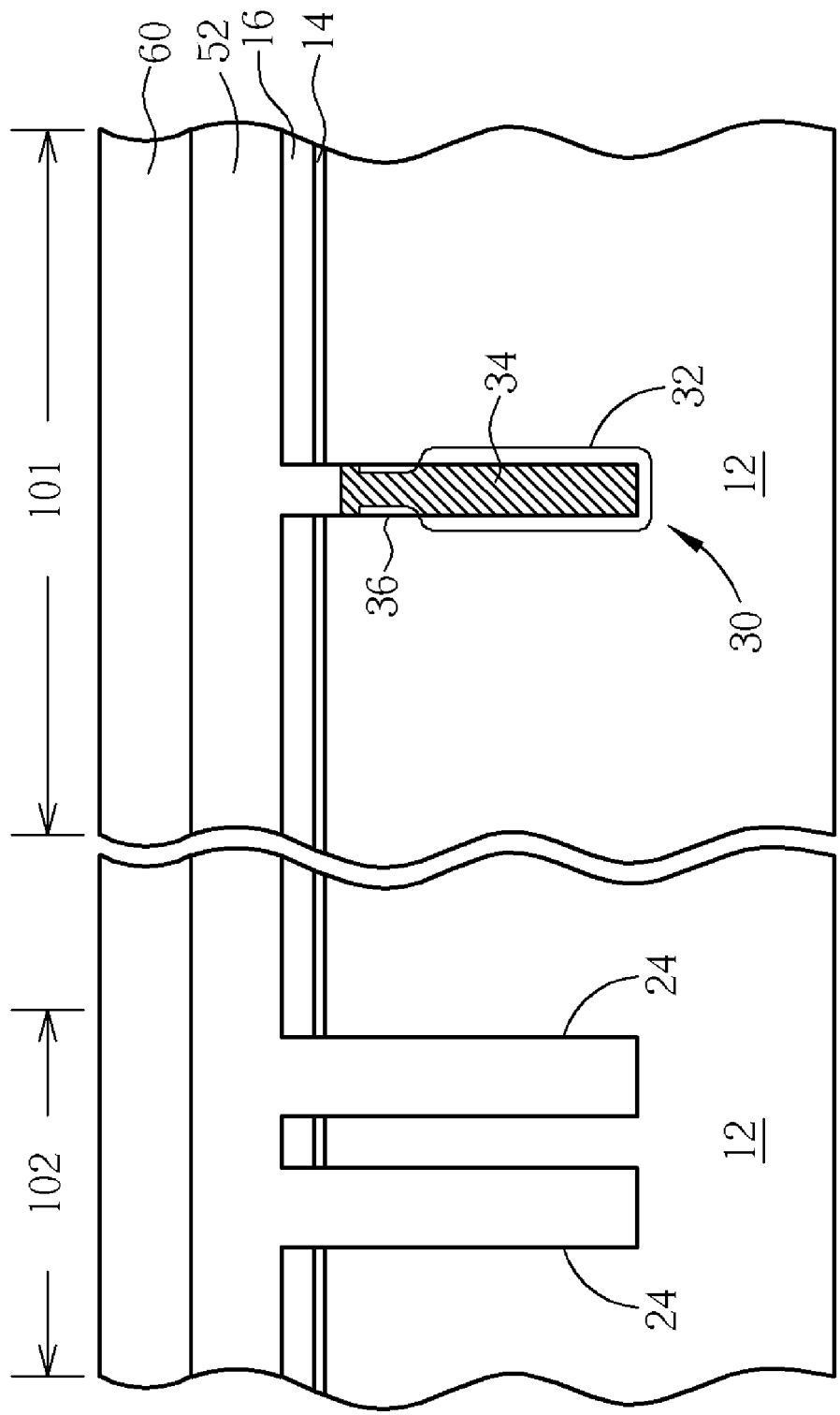

As shown in FIG. 6, a photo resist layer 60 is coated on the top surface of the planarization layer 52. In the subsequent lithographic process, the photo resist layer 60 will be used to define active areas on the semiconductor substrate 12. After coating the photo resist layer 60, the photo resist layer 60 is subjected to conventional light exposure, development and baking processes.

Figure 7:
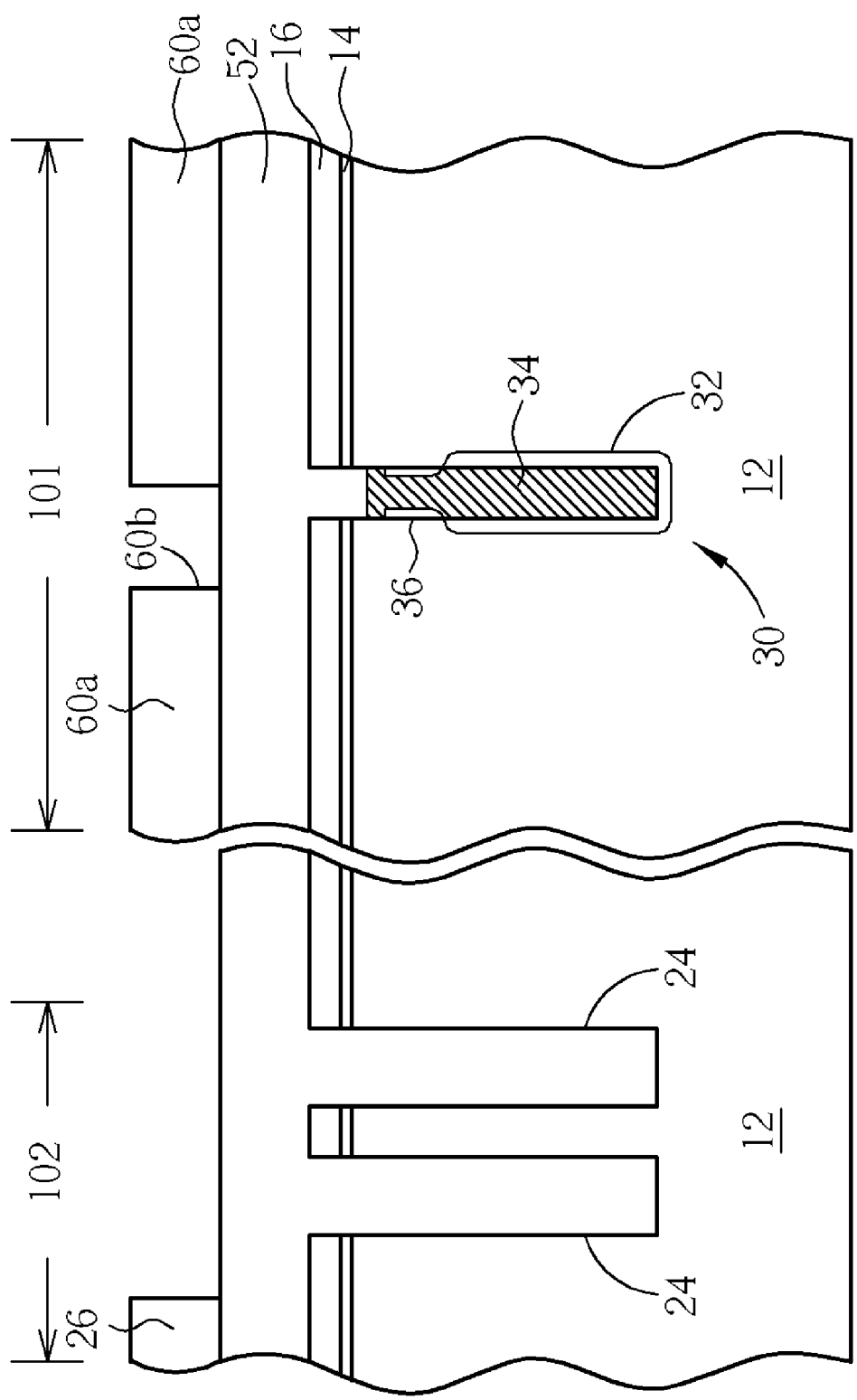

As shown in FIG. 7, after the exposure and development of the photo resist layer 60, an active area (AA) pattern 60a and an opening 60b are formed in the photo resist layer 60 within the device region 101. The opening 60b exposes the area to be etched into the semiconductor substrate 12, which is a shallow trench isolation (STI) area. Simultaneously, an existing-layer photo resist pattern 26 is also formed within the alignment-mark forming region 102. The deep trench lines 24 of the previous-layer alignment pattern 20' and the existing-layer photo resist pattern 26 together form an overlay (alignment) mark 20.

Figure 9:
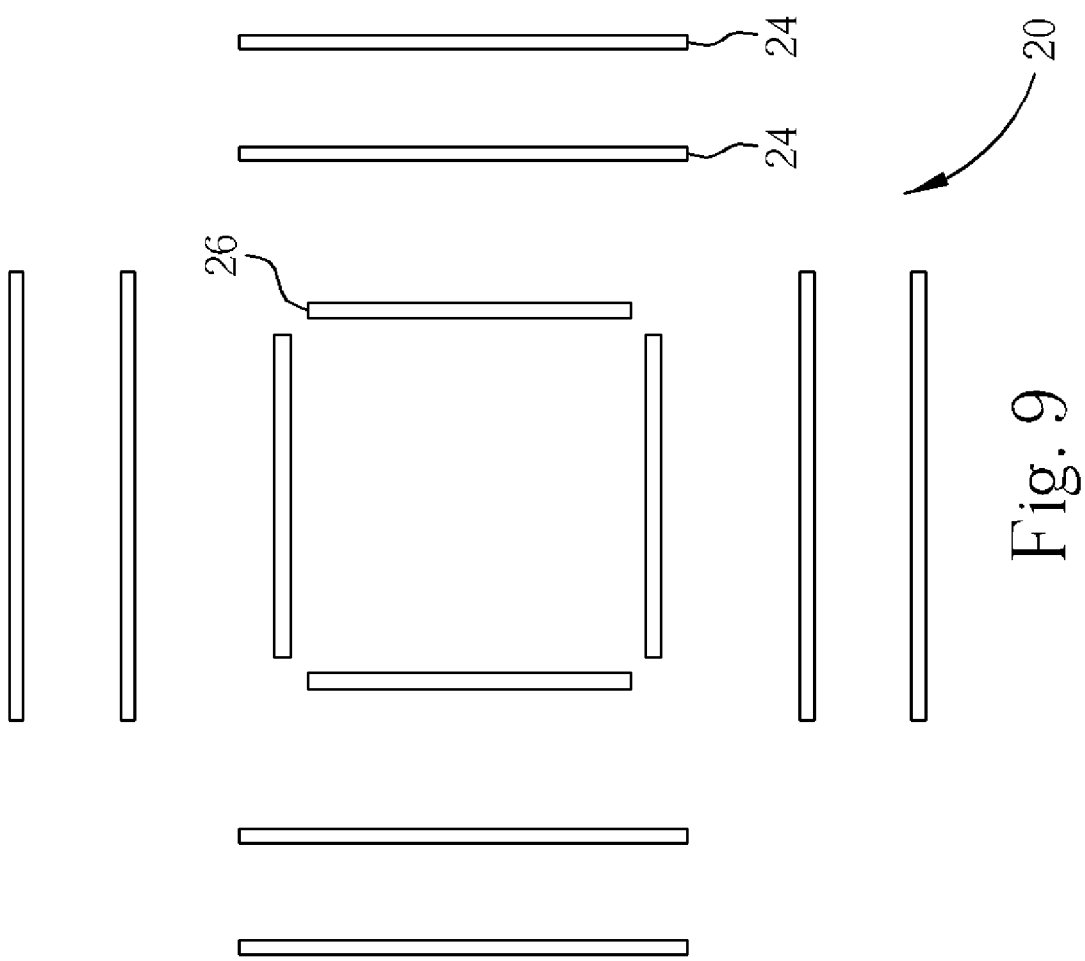
FIG. 9 depicts a schematic top view of the overlay mark in accordance with one preferred exemplary embodiment of this invention.

The schematic top view of the overlay mark 20 is depicted in FIG. 9. The optical alignment device of a stepper and scanner focuses on the overlay mark 20 so as to assess AA-DT overlay accuracy. If the calibration deviation is greater than some specification value, for example, 3 sigma<25 nm, the AA pattern 60a is not accurately overlaid on the deep trench capacitor structure 30 and rework of the photo resist layer 60 may be required.

Figure 10:
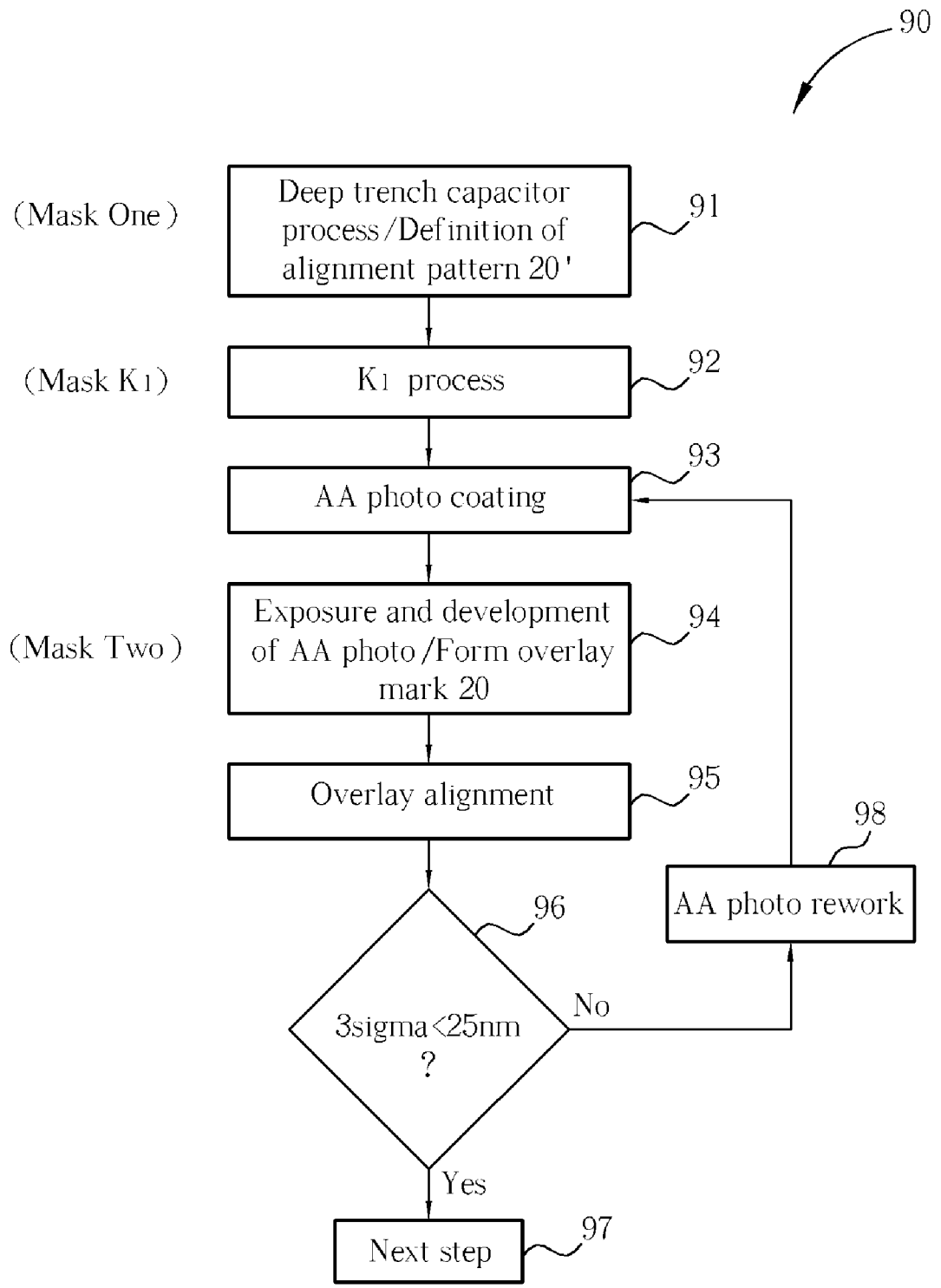
FIG. 10 is a flow chart demonstrating the front-end process for fabricating a deep trench capacitor DRAM device in accordance with the preferred embodiment of this invention.

Please refer to FIG. 10. FIG. 10 is a flow chart demonstrating the front-end process for fabricating a deep trench capacitor DRAM device in accordance with the preferred embodiment of this invention. As shown in FIG. 10, the process flow 90 includes the following steps:

Step 91: Deep trench capacitor process and definition of alignment pattern 20' including deep trench lines 24 (Photo mask-One).

Step 92: k1 process comprising using an additional photo resist layer to expose the alignment pattern 20' and then etching or "refresh" the alignment pattern 20' (Photo mask-k1)

Step 93: Coating AA photo resist on the wafer after the k1 process.

Step 94: Exposure and development of the AA photo resist to form overlay mark 20 (Photo mask-Two).

Step 95: Overlay alignment process using the overlay mark 20.

Step 96: Assessing the overlay accuracy. If the overlay accuracy is ok, then go to Step 97 (next stage); if the overlay accuracy doest not meet the requirement, go to Step 98.

Step 98: Reworking the AA photo resist.

To sum up, the present invention uses small-size (w<0.5 micrometers) alignment pattern 20' in combination with a "k1 process", which is particularly suited for the fabrication of trench-capacitor DRAM devices which requires highly accurate AA-DT and GC-DT overlay accuracy. The "k1 process" is utilized to etch away polysilicon studded in the deep trench lines 24 of the alignment pattern 20' and to refresh the trench profile, thereby improving overlay accuracy and precision.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a microelectronic device, comprising:
    providing a semiconductor substrate comprising thereon a device region and an alignment-mark forming region;
    forming a trench in the semiconductor substrate within the device region, and simultaneously, forming a previous-layer alignment pattern in the semiconductor substrate within the alignment-mark forming region, wherein the previous-layer alignment pattern comprises a plurality of trench lines;
    forming a capacitor structure within the trench comprising at least a conductive layer in the trench, wherein the trench lines also comprises the conductive layer;
    forming a first photo resist layer over the semiconductor substrate and performing an exposure process to form an opening in the first photo resist layer, wherein the opening only exposes the previous-layer alignment pattern in the alignment-mark forming region;
    using the first photo resist layer as a mask, performing an removing process to remove the conductive layer inside the trench lines;
    removing the first photo resist layer;
    forming a second photo resist layer over the semiconductor substrate;
    patterning the second photo resist layer in both the device region and the alignment-mark forming region, and simultaneously, forming an existing-layer photo resist pattern within the alignment-mark forming region, wherein the existing-layer photo resist pattern and the previous-layer alignment pattern together form an overlay mark; and
    using the overlay mark to assess AA-DT (active area-deep trench) overlay accuracy.

2. The method according to claim 1 wherein before forming the second photo resist layer on the semiconductor substrate, the method further comprises the following step:
    depositing a planarization layer on the semiconductor substrate.

3. The method according to claim 2 wherein the planarization layer comprises boron-doped silicate glass (BSG), BPSG, TEOS oxide or combinations thereof.

4. The method according to claim 1 wherein after the removing process, the depth of the trench lines ranges between 3000 angstroms and 8000 angstroms.

5. The method according to claim 1 wherein the line width of each trench line ranges between 0.2 micrometer and 0.3 micrometer.

6. The method according to claim 1 wherein each of the trench lines has a line width that is less than or equal to 0.5 micrometer.

7. A method for fabricating a microelectronic device, comprising:
    providing a substrate comprising thereon a device region and an mark forming region;
    forming a trench in the substrate within the device region, and simultaneously, forming a first pattern structure in the substrate within the mark forming region, wherein the first pattern structure comprises a plurality of trench lines;
    forming at least a material in the trench and simultaneously forming the material in the trench lines;
    forming a first patterning layer over the substrate comprising an opening, wherein the opening exposes the first pattern structure in the mark forming region;
    removing at least a part of the material inside the trench lines;
    removing the first patterning layer;
    forming a second patterning layer over the semiconductor substrate, the second patterning layer comprising a second pattern structure within both the device region and the alignment-mark forming region, wherein the first pattern structure and the second pattern structure in the alignment-mark forming region constitute an overlay mark; and
    using the overlay mark to assess AA-DT (active area-deep trench) overlay accuracy.

8. The method according to claim 7 wherein before forming the second patterning layer on the semiconductor substrate, the method further comprises the following step:
    depositing a planarization layer on the semiconductor substrate.

9. The method according to claim 8 wherein the planarization layer comprises boron-doped silicate glass (BSG), BPSG, TEOS oxide or combinations thereof.

10. The method according to claim 7 wherein after the removing process, the depth of the trench lines ranges between 3000 angstroms and 8000 angstroms.

11. The method according to claim 7 wherein the material inside the trench lines is completely removed.

12. The method according to claim 7 wherein the material inside the trench lines is partially removed.

* * * * *